United States Patent [19]

Hallman et al.

[11] Patent Number: 5,505,808
[45] Date of Patent: Apr. 9, 1996

[54] METHOD TO PRODUCE AN INORGANIC WEAR LAYER

[75] Inventors: Robert A. Hallman, Mt. Joy; Jeffrey S. Ross, Millersville, both of Pa.

[73] Assignee: Armstrong World Industries, Inc., Lancaster, Pa.

[21] Appl. No.: 92,039

[22] Filed: Jul. 15, 1993

Related U.S. Application Data

[63] Continuation-in-part of Ser. No. 808,952, Dec. 13, 1991, abandoned, which is a continuation of Ser. No. 305,289, Feb. 2, 1989, abandoned.

[51] Int. Cl.$^6$ .................................................. B32B 31/04
[52] U.S. Cl. .................. 156/233; 156/155; 156/230; 156/247; 156/249; 156/289
[58] Field of Search ................................ 156/155, 275.5, 156/152, 230, 231, 232, 234, 236, 237, 239, 240, 242, 233, 235, 238, 289, 249

[56] References Cited

U.S. PATENT DOCUMENTS

| | | | |
|---|---|---|---|
| 3,480,497 | 11/1969 | Morse | 156/155 X |
| 3,658,617 | 4/1972 | Fearnow | 156/235 |
| 4,022,943 | 5/1977 | Erb et al. | 264/DIG. 82 X |
| 4,126,727 | 11/1978 | Kaminski | 156/277 X |
| 4,138,299 | 2/1979 | Bolgiano | 428/443 |
| 4,215,170 | 7/1980 | Vilaprinyo Oliva | 156/233 X |
| 4,255,208 | 3/1981 | Deutscher | 156/155 X |
| 4,267,240 | 5/1981 | Jaisle et al. | 156/289 X |
| 4,330,352 | 5/1982 | Grimes et al. | 156/249 X |
| 4,331,736 | 5/1982 | Schafer et al. | 156/289 X |
| 4,357,395 | 11/1982 | Lifshin et al. | 156/249 X |
| 4,382,831 | 5/1983 | Clough et al. | 156/249 X |
| 4,384,904 | 5/1983 | Kauffman | 156/78 X |
| 4,421,827 | 12/1983 | Phillips | 156/330 X |
| 4,440,826 | 4/1984 | Witman | 428/908.8 |
| 4,483,732 | 11/1984 | Penta et al. | 156/247 |
| 4,528,231 | 7/1985 | Lund | 428/908.8 |
| 4,604,181 | 8/1986 | Mirtich et al. | 204/298 |
| 4,702,963 | 10/1987 | Phillips et al. | 428/426 |
| 4,770,923 | 9/1988 | Wasa | 428/425.8 |
| 4,804,430 | 2/1989 | Miekka | 156/233 |
| 4,880,689 | 11/1989 | Park et al. | 428/908.8 |
| 4,880,869 | 11/1989 | Park | 428/143 X |
| 4,983,466 | 1/1991 | Witman | 428/908.8 |
| 5,017,255 | 5/1991 | Calhoun | 156/233 X |
| 5,073,425 | 12/1991 | Dees, Jr. et al. | 428/908.8 |
| 5,077,112 | 12/1991 | Hensel | 428/76 X |
| 5,156,720 | 10/1992 | Rosenfeld | 205/76 X |
| 5,288,353 | 2/1994 | Revankar | 156/242 X |

FOREIGN PATENT DOCUMENTS 2202237  9/1988  United Kingdom.

OTHER PUBLICATIONS

Eli Yablonovitch et al, *Appl. Phys. Letter*, 51(26), 28 Dec. 1987, pp. 2222–2224; article entitled "Extreme Selectivity in the Lift–Off of Epitaxial GaAs Films".

L. A. Clevenger et al., *Appl. Phys. Letter*, 52(10), 7 Mar. 1988, pp. 795–797; article entitled "Reaction Kinetics of Nickel/ Silicon Multilayer Films".

Ryszard Lamber, *Journal of Materials Science Letters* 5 (1986), pp. 177–178; article entitled "Thin Boehmite Films: Preparation and Structure".

J. C. Huling et al, *J. Am. Ceram. Soc.*, 71[4] C–222—C–224 (1988); article entitled "A Method for Preparation of Unsupported Sol–Gel Thin Films".

"The Preparation and Use of Unbacked Metal Filsm as Filters in the Extreme Ultraviolet," W. R. Hunter, Physics of Thin Film, vol. 7, Academic Press, 1973, pp. 43–114.

*Primary Examiner*—David A. Simmons
*Assistant Examiner*—M. Curtis Mayes

[57] ABSTRACT

Vapor deposited metal nitride or oxide thin films serve as a wear layer for surface coverings after being formed on a release layer and transferred to an organic layer. A release layer such as sodium chloride on glass can be dissolved by water; while a self-supporting release layer can be removed by solvent, etching, laser abatement, or delamination.

20 Claims, 1 Drawing Sheet

METHOD TO PRODUCE AN INORGANIC WEAR LAYER

This application is a continuation-in-part of application Ser. No. 808,952, filed Dec. 13, 1991, now abandoned, which is a continuation of application Ser. No. 305,289, filed Feb. 2, 1989, now abandoned.

FIELD OF THE INVENTION

The invention relates to inorganic layers on organic layers. More particularly, the invention relates to forming a wear layer on a release layer which can be removed after the wear layer is bonded to a polymeric composition.

BACKGROUND OF THE INVENTION

Reduced pressure environment techniques for depositing films of hard inorganic materials up to several micron thickness are sputtering, plasma polymerization, physical vapor deposition, chemical vapor deposition, ion plating, etc. Hard inorganic materials which can be prepared using these techniques include metals, metal oxides, metal nitrides, mixtures, etc. Often the partial pressures of key gases in the deposition environment are controlled to effect chemical reactions between depositing metal species. Thus, a film formed on a substrate by reactive sputtering or reactive deposition can be a compound derived from a metal and a controlling gas, i.e. aluminum oxide produced by sputtering aluminum in oxygen. Sometimes the controlling gases are used to sustain a plasma in the deposition environment. Ion assisted deposition is a technique in which the controlled gas is ionized and is used to bombard the deposition surface to modify the morphology and physical properties of the resulting film. A critical review of vapor deposition technology related to hard coatings was presented by J. E. Sundgren and H. T. C. Hentzell in *J. Vac. Sci. Tech.* A4(5), September/October 1987, 2259–2279. A more complete review of techniques involved in formation of thin films in reduced pressure environments is the book edited by J. L. Vossen and W. Kern, *Thin Film Processes*, Academic, New York, 1978.

Thin film literature describes the use of both organic and inorganic materials as release layers for the preparation of free standing films. The impetus for preparing such films has been to allow a free standing material to be analyzed by microscopy, x-ray diffraction or surface analytical techniques.

Recent articles on thin film preparation include Yabinouitch, E., Gmitter, J. P., Haubison, J. P. and Bhat, R., *Appl. Phys. Letter*, 51(26), Dec. 28, 1987, 2222–2224 on etching Al/As to form free standing GaAlAs films; Clevenger, L. A., Thompson, C. V. and Cammarata, R. C., *Appl. Phys. Letter*, 52(10), Mar. 7, 1988, 795–797 on using commercial photoresists as supports; Ryszard Lamber, Thin Boehmite Films: Preparation and Structure; *Journal of Materials Science Letters*, 5(1986), 177–178; and Huling and Messing, *J. Am. Ceram. Soc.*, 71(4), 1988, C222–C224, on coating on camphor and subliming to obtain free standing mullite.

Patents dealing with thin film deposition include U.S. Pat. Nos. 4,604,181 and 4,702,963.

While it would be desirable to deposit thin metal-containing films on polymer compositions to serve as wear layers, direct application often destroys or degrades the polymer composition or results in poor adhesion or film quality. Thus, it would advance the art to provide a suitable means for joining a thin metal-containing film with polymer compositions.

SUMMARY OF THE INVENTION

An object of the invention is to provide an inorganic wear layer on an organic surface covering composition, wherein the wear layer is formed on a soluble or detachable release layer which is dissolved or detached after bonding the wear layer to the surface covering composition. Because an inorganic wear layer is formed on the release layer before being bonded to the organic surface covering composition, the release layer can reach a temperature greater than the melting point or decomposition temperature of the organic composition without destroying or degrading the organic composition.

A preferred composition comprises about 1 to 3 microns thick aluminum oxide bonded to a urethane acrylate layer of a vinyl surface covering, wherein the aluminum oxide is deposited on sodium chloride and the sodium chloride is dissolved away after bonding of the aluminum oxide and urethane acrylate.

Other useful wear layers include silicon oxide, aluminum nitride, titanium nitride, silicon nitride, zirconium oxide, titanium dioxide, and combinations thereof. Other release layers include alkali or alkaline earth halides or oxides, metals or graphite. Deposition may be on a substrate formed entirely from the release material, on a carrier support coated with release material, or on a soluble support such as a photoresist.

A method of producing a wear layer on a surface covering comprises:
(a) providing a layer of surface covering material,
(b) providing a layer of release material,
(c) providing an organic composition material,
(d) depositing a metal and/or metal compound on the release layer to form a thin metallic film,
(e) applying the organic composition material to the thin metallic film on the side opposite the release layer to form a composite,
(f) laminating the organic composition side of the composite to the layer of surface covering material, and
(g) removing the release layer.

One method of the invention to produce a wear layer on a surface covering comprises the steps:
(1) depositing a water soluble metal halide or oxide on a substrate to form a release layer,
(2) depositing metal and/or metal compound on the release layer to form a thin film,
(3) contacting an energy curable composition to the thin film,
(4) curing the composition to bond the thin film as a wear layer, and
(5) washing with water to remove the release layer.

In one preferred embodiment, the energy curable composition is a curable organic composition, and more preferably, the curable composition is a urethane-acrylate.

Another method of the invention to produce a wear layer on a surface covering comprises the steps:
(1) depositing metal and/or metal compound on a self-supporting release layer to form a thin film,
(2) contacting a polymer composition to the thin film, and (3) laminating to bond the thin film as a wear layer while releasing the self-supporting release layer.

Alternatively, a method comprises the steps:

(1) preparing a self-supporting stripping or etching composition as a release layer,
(2) depositing metal or metal compound on the release layer to form a thin film,
(3) contacting an energy curable composition to the thin film,
(4) curing the composition to bond the thin film as a wear layer, and
(5) removing the release layer to produce a wear layer surface covering.

DETAILED DESCRIPTION OF THE INVENTION

The problem addressed by the invention is how to combine a thin inorganic film with polymers which cannot withstand conditions employed during film formation. Five significant factors influence thin film depositions which work against direct application.

I. The physical properties of the deposited films often depend on the temperature during deposition, improving with increased temperature.

II. Temperature reduction methods such as ion assist, laser assist, and ion plating may impair adhesion between a deposited film and substrate.

III. Growth patterns typical of low substrate temperatures yield high surface roughness and thereby provide defect sites for film failure.

IV. Some substrates are thermally or chemically unstable in the deposition environment.

V. The difference in the coefficient of thermal expansion between polymer and inorganic films leads to stresses that can cause cracking during temperature changes experienced during deposition or subsequent cooling steps.

Since factors like increased temperature promote degradation or even destruction of a polymer composition, it remained for the present invention to provide a means to join an inorganic wear layer with an organic surface covering composition.

The invention accomplishes indirectly what could not be done directly. A thin film is deposited on a release layer which is on a temporary support or is itself a temporary support. The following drawings illustrate these modes of practice of the invention.

DETAILED DESCRIPTION OF THE DRAWINGS

Figure 1A:
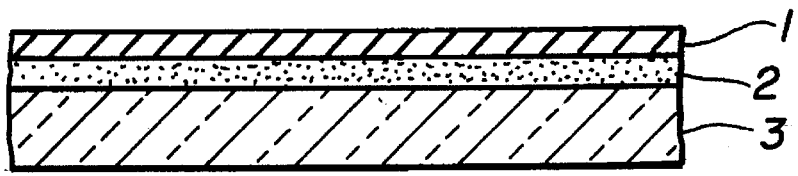
FIG. 1A shows a wear layer on soluble release layer on temporary substrate.

FIG. 1A—A temporary support 3 has an applied soluble release layer 2 on which is applied a thin inorganic film 1. A support such as porous glass 3 can bear a vapor deposited sodium chloride layer 2 onto which a 1 to 3 micron aluminum oxide layer 1 is vapor deposited.

Figure 1B:
FIG. 1B shows a wear layer on release layer.

FIG. 1B—A self-supporting release layer 4 has an applied thin inorganic film 1. A NaCl crystal 4 bears a thermal evaporated silicon oxide layer 1.

Figure 2A:
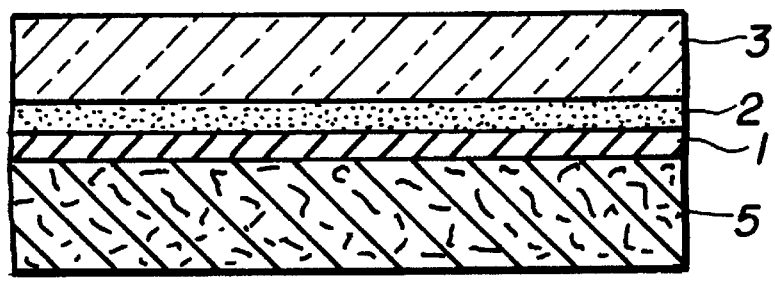
FIG. 2A shows the FIG. 1A structure on a surface covering.

FIG. 2A—The thin inorganic film 1 of the FIG. 1A structure is placed in contact with a polymeric composition 5. The polymeric composition can be a photocurable urethane-acrylate which can be bonded to the aluminum oxide layer 1 by ultraviolet exposure. Washing with water dissolves away the sodium chloride 2 and removes the temporary support 3.

Figure 2B:
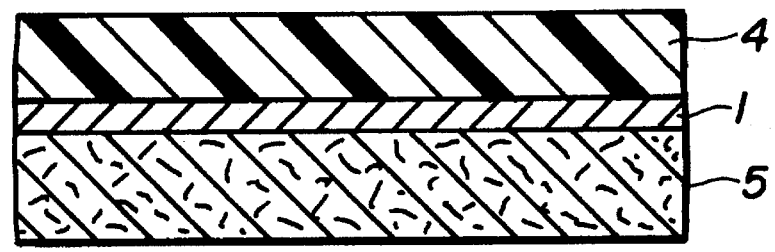
FIG. 2B shows the FIG. 1B structure on a surface covering.

FIG. 2B—The thin inorganic film 1 of the FIG. 1B structure is placed in contact with a polymeric composition 5. The polymer composition can be a thermal-curable elastomer which can be bonded to a silicon oxide layer I by infrared exposure. The NaCl crystal 4 is a solid substrate which detaches when exposed to water vapor and thus, the temporary substrate 4 releases from layer 1 while layer 5 is bonding to it.

Figure 3:
FIG. 3 shows the wear layer of FIGS. 1 or 2 on a surface covering with the release layer removed.

FIG. 3—The end result from dissolution in FIG. 2A or detachment in FIG. 2B is the thin inorganic wear layer 1 bonded to a surface covering 5. Layer 1 can be aluminum oxide, silicon oxide, boron nitride, etc., bonded to urethane-acrylate, elastomeric, etc. 5. Layers 1 and 5 can be the top portion of a vinyl surface covering.

The invention overcomes the sensitivity of organic compositions to the harsh environmental conditions of vapor deposition by formation of the film on a release layer and then bonding it to the organic composition. The organic compositions which may form the surface covering include polyvinyls, acrylates, methacrylates, polyolefins, polyesters, polycarbonates, polyurethanes, aminoplasts, copolymers and terpolymers of the above polymers, and sol-gels. Examples of the above organic compositions include hexanediol diacrylate, tripropylene glycol diacrylate, lauryl acrylate, β-carboxyethylacrylate, polyethylene, polypropylene, polyethyleneterephthalate, urea formaldehyde, and melamine formaldehyde. As shown in the figures, the release layer may be self-supporting or present on a temporary support.

Techniques for depositing a hard inorganic layer on a release layer include cathode sputtering, vapor deposition, glow discharge sputter deposition, magnetron sputter deposition, ion beam sputter deposition, ion beam deposition, electron beam vapor deposition, thermal vapor deposition, ion beam assisted (thermal or electron beam) vapor deposition, ion plating, chemical vapor deposition, and plasma polymerication. These are described in more detail in the references in the Background of the Invention.

Hard inorganic materials suitable for deposited thin films include aluminum oxide, silicon oxide, tin and/or indium oxide, titanium dioxide, zirconium dioxide, tantalum oxide, chromium oxide, tungsten oxide, molybdenum oxide, aluminum nitride, boron nitride, silicon nitride, titanium nitride, zirconium nitride and combinations including the above materials or materials such as metals, metal pnictides, or metal chalogenides. Other obvious hard inorganic materials which can be deposited include amorphous carbon, diamond like carbon, diamond, silicon oxynitride, aluminum oxynitride and carbon nitride.

Polymeric or organic compositions suitable for bonding to an inorganic layer formed on a release layer include acrylate urethane, polyvinyl chloride (PVC), polymethylmethacrylate (PMMA), polyolefins, polyethers, polystyrenes, polyimides, and copolymers and terpolymers of acrylonitrile, acrylate, methacrylate, acrylic acid, etc. The bonding material may comprise polymers, copolymers and terpolymers of epoxides, silicones, polyvinyle, polyolefins, polyethers, polystyrenes, polyimides, acrylonitriles, acrylates and methacrylates. In particular, it is preferred to use surface covering compositions containing plasticizers and other lower molecular weight organics which volitilize under a reduced pressure environment.

Release layers which can be present on a temporary support such as glass, quartz, sapphire, marble, silicon, aluminum, steel, and water soluble salts including sodium chloride, potassium chloride, calcium chloride, strontium oxide, or calcium oxide.

Release layers which are self-supporting include negative and positive working photoresists, marble, ferrotype, black wax (Apiezon® W), sodium chloride crystals or potassium chloride crystals.

While it may be convenient to wash off the release layer with water or solvent, other techniques to remove the release layer include etching, laser ablation, combustion, pyrolysis, sublimation, delamination, or melting.

The process of the invention can be summarized by four parts: I. Manufacture of a self-supporting release layer or deposition of a release layer on a temporary support; II. Deposition of an inorganic film on the release layer; III. Adhering the film to a polymeric composition; and IV. Removing the release layer from the film.

The invention has industrial applicability in the manufacture of surface coverings, including floor coverings, with improved wear properties and applications where a metal-containing layer is required to be combined with a polymeric layer.

The following examples, while not intended to be exhaustive, illustrate the practice of the invention. *Procedure for the Preparation of Vapor Deposited Coatings*

Coating Materials. Metals and metal oxides were obtained in 99.9% nominal purity from standard industrial sources. Water was removed from gases using molecular sieve traps. $Al_2O_3$ (99.99%) and $SiO_2$ (99.99%) were obtained from E. M. Industries; $ZrO_2$ (99.7%) and $Ta_2O_5$ (99.8%) were obtained from Cerac, Inc.; $TiO_2$ (99.9%), was obtained from Pure Tech, Inc.

Substrates. Substrates consisted of Fisher-brand "pre-cleaned" glass microscope slides or Corning Vycor® glass which were vigorously cleaned by successive five minute ultrasonic treatments in, respectively, 5% 'MICRO' cleaning solution (International Products Corp.), deionized water, acetone (ACS grade, Fisher), and methanol (ACS grade, Fisher), and dried in a positive pressure hood immediately prior to use. In the event that a cleaning solution was not compatible with a substrate, that solution was eliminated from the cleaning sequence. The samples were subjected to an additional $Ar^+$ plasma cleaning step before initiation of any deposition process. Stainless steel templates were used to affix the cleaned slides to the 8" diameter substrate holders in the DV-SJ/26 planetary rotation subassembly.

Apparatus. The deposition system (Denton DV-SJ/26) included a 66 cm wide high vacuum bell-jar assembly; a high speed pumping system (CTI Cryogenics CT-10 cryopump and Alcatel ZT 2033 mechanical pump); an electron-beam vaporization source (Temescal STIH-270-2MB four-health "Supersource", with an 8 kWatt Temescal CV-8 high-voltage controller and e-beam power supply and Tomescol XYS-8 sweep control); a resistively heated vaporization source (Denton Vacuum, 4 kWatt); a cold cathode ionization source (Denton Vacuum model CC101 with both CC101BPS and CC101PS biased and unbiased power supplies); a residual gas analyzer (Inficon Quadrex 200); a quartz crystal type deposition rate controller (Inficon IC6000); four eight inch circular deposition targets affixed to a planetary rotation subsystem; and a 10" diameter stainless steel aperature for focusing the e-beam (or thermally) evaporated material and the ion plasma on the same deposition surface. The various power supplies, pressure and gas flow monitors were operated either automatically using Denton's customized process control system, or manually. Typically, a deposition run began with an automated pump-down process, was followed by a deposition process controlled by the IC6000 and ended with an automated venting cycle.

Deposition Process. The following general procedure was followed for all deposition runs. Following evacuation to $\leq 1.0 \times 10^{-5}$ Torr the temperature of the chamber, as measured by a centered thermocouple at planet level, was adjusted to the desired deposition temperature and the planetary rotation was started. Next, Ar gas was admitted to increase the chamber pressure to about $1 \times 10^{-4}$ Torr, and a plasma 300–600 mAmps/300–600 Volts was initiated at the cold cathode source (current density between 95 and 500 µ-amps $cm^2$) which was used to sputter-clean the substrates, in situ, for five minutes. The deposition process was thereafter controlled by an IC6000 process which typically included parameters such as heating rates and times, material densities, desired deposition rates and thicknesses, and the number of layers desired. Prior to deposition, the substrates were shielded from the metal, or metal oxide source. Ion bombardment with an ion plasma began and the shields were removed simultaneously when the IC6000 signalled that the metal or metal oxide had been heated to the temperature appropriate for vaporization. A quartz crystal microbalance provided input for the IC6000 feedback loop system which provided deposition rate control for the remainder of the process. After deposition of a specified thickness, the ion source was turned off, the shields replaced, and the vapor sources allowed to cool. The preferred thickness of the deposited metallic film is 1 to 3 microns.

EXAMPLE 1

A glass temporary substrate was placed in the vacuum system described above (Denton DV-SJ/26). With a pressure below $1 \times 10^{-3}$ torr, a 200 angstrom layer of sodium chloride was deposited using a 6 Kvolt electron beam source. The same electron beam source was then used to deposit a one micron layer of aluminum oxide. The layer was amorphous with a fine morphology and had a grain size below 100A.

A photoreactive layer was prepared as described in U.S. Pat. No. 4,138,299, which is incorporated by reference, comprising:

| | |
|---|---|
| Prepolymer (Glycerol/adipic acid/diol) | 43 g |
| Polycaprolactone diol | 58 g |
| 2-Ethylhexylacrylate | 94 g |
| Hexanediol diacrylate | 62 g |
| 4,4'-diisocyanato dicyclohexylmethane | 132.2 g |

4,4'-diisocyanato dicyclohexylmethane 132.2 g.

The ingredients were applied to a vinyl composition to produce a surface covering of which the photoreactive urethane-acrylate composition was the top layer. The aluminum oxide layer was then placed in contact with the urethane-acrylate composition and an ultraviolet exposure of 3 joules/$cm^2$ bonded the metallic oxide thin film with the surface covering to serve as a wear layer. Washing in water dissolved the sodium chloride so that the glass temporary support could be removed.

EXAMPLE 2

Using the techniques of Example 1, titanium nitride was deposited on a polished marble substrate, which served as a temporary support without a release layer. The deposited titanium nitride was then laminated to a layer of polymethylmethacrylate. The transferred layer of titanium nitride carried over the pattern from the polished marble temporary support. Also, the polished marble was available for a repetition of the process.

EXAMPLE 3

Using the techniques of Example 1, a 3.0 micron layer of aluminum oxide was deposited on a 5 mil thick sheet of aluminum foil which served as a temporary substrate without a release layer. The deposited $Al_2O_3$ was then laminated, with an epoxy adhesive, to a layer of rigid PVC previously adhered to a vinyl tile support layer. The aluminum foil was etched from the composite structure with aqua regia to leave a structure wherein the top layer consisted of an aluminum oxide layer which was laminated with an epoxy adhesive to a vinyl tile supported rigid PVC supported layer. This example demonstrates how a material which contains a decorative pattern, such as a rigid PVC coated vinyl tile base may be laminated to a hard thin inorganic film which was previously supported by an aluminum foil substrate. Etching away the aluminum foil creates a composite wherein the decorated rigid vinyl coated vinyl tile substrate, which is not compatible with the deposition environment of $Al_2O_3$, may have a hard inorganic protective coating such as $Al_2O_3$ applied without exposure to the deposition environment.

A ¼" thick Corning VYCOR® brand Glass substrate was cleaned, dried, and baked out in the deposition chamber according to the manufacturers specifications. NaCl and $Al_2O_3$ layers were deposited as in Example 1 except that the thickness of the layers were 500 angstroms of NaCl and 3.0 microns of $Al_2O_3$. This composite was bonded to and released from a urethane-acrylate layer as in Example 1. An important aspect of this example is that a pattern in the surface of the Vycor Glass was transmitted to the photocured urethane-acrylate/aluminum oxide structure. This resulted in a final structure of aluminum oxide bonded to a urethane-acrylate substrate which had the appearance of an embossed structure.

Table 1 contains comparative parameters for (a) deposition of aluminum oxide on a sodium chloride release layer on glass which represents FIGS. 1A, 2A, and 3, (b) deposition of titanium nitride on marble which represents FIGS. 1B, 2B, and 3, (c) deposition of aluminum oxide on aluminum foil, and (d) deposition of aluminum oxide on a sodium chloride release layer on glass.

TABLE 1

|  | (a) | (b) | (c) | (d) |
| --- | --- | --- | --- | --- |
| Material | $Al_2O_3$ | $TiN_x$ | $Al_2O_3$ | $Al_2O_3$ |
| Evaporant | $Al_2O_3$ | Ti | $Al_2O_3$ | $Al_2O_3$ |
| Crucible Liner | None | Carbon | None | None |
| Power Source | 6 KV e-beam | 6 KV e-beam | 6 KV e-beam | 6 KV e-beam |
| Final Thickness | 0.2 microns | 2.4 microns | 3.0 microns | 3.0 microns |
| Deposit Time | 33 minutes | 100 minutes | 145 minutes | 145 minutes |
| Ion Assist Gas | $O_2$ | $N_2$ | $O_2$ | $O_2$ |
| Ion Assist Volts | 600 | 600 | 600 | 600 |
| Ion Assist Mamps | 600 | 300 | 600 | 600 |
| Start Temperature | 42° C. | 32° C. | 93° C. | 17° C. |
| End Temperature | — | 98° C. | 167° C. | 170° C. |
| Pressure | $<5 \times 10^{-4}$ Torr | $<2 \times 10^{-4}$ Torr | $<5 \times 10^{-4}$ Torr | $<5 \times 10^{-4}$ Torr |
| Polymer | Urethane-acrylate | PMMA | Rigid vinyl | Urethane-acrylate |
| Substrate | Glass | Marble | Al Foil | Vycor® Glass |
| Release Layer | NaCl | Marble | Al Foil | NaCl |
| Release Method | Photocure/$H_2O$ | Pressure | Pressure/Etch | Photocure |

What is claimed is:

1. A method of producing an inorganic wear layer on a surface covering comprising:
   (a) providing a layer of surface covering comprising an organic material,
   (b) providing a release layer, comprising a release material,
   (c) depositing an inorganic material directly on the release layer by a reduced pressure environment technique to form a thin inorganic film,
   (d) laminating the side of the thin inorganic film opposite the release layer to the layer of organic surface covering material, and
   e) removing the release layer, whereby the surface of the thin inorganic layer is exposed and functions as a wear layer.

2. The method of claim 1 wherein the release layer reaches a temperature greater than the melting point of the organic composition during formation of the thin inorganic film.

3. The method of claim 1 wherein the release layer reaches a temperature greater than the decomposition temperature of the organic composition material during formation of the thin inorganic film.

4. The method of claim 1 wherein the thin inorganic film has a thickness of 1 to 3 microns.

5. The method of claim 1 wherein the surface covering is a floor covering.

6. A method of producing a metal and/or metal compound wear layer on a surface covering comprising:
   (a) providing a layer of surface covering comprising a material selected from the group consisting of vinyl and polymethylmethacrylate,
   (b) providing a release layer comprising a material selected from the group consisting of glass, quartz, sapphire, marble, sodium chloride, potassium chloride, calcium chloride, strontium oxide, and calcium oxide,
   (c) providing a bonding material comprising an organic composition selected from the group consisting of polyvinyl chloride, polymethylmethacrylate, polyolefin, polyether, polyimide, and copolymers and terpolymers of acrylonitrile, acrylate and methacrylate, (d) depositing a metal and/or metal compound on the release layer by a reduced pressure environment technique to form a thin metallic film, (e) applying the bonding material to the thin metallic film on the side opposite the release layer to form a composite, (f) laminating the bonding material side of the composite to the layer of surface covering, and (g) removing the release layer to expose the thin metallic film which functions as a wear layer.

7. The method of claim 6 wherein the metal and/or metal compound is deposited on the release layer by a vapor deposition technique.

8. A method of producing an inorganic wear layer on a surface covering comprising:

(a) providing a layer of surface covering comprising a material selected from the group consisting of polyvinyls, acrylates, methacrylates, polyolefins, polyesters, polycarbonates, polyurethanes, aminoplasts, copolymers and terpolymers of the above polymers, and sol-gels, (b) providing a release layer comprising a material selected frown the group consisting of glass, quartz, sapphire, marble, silicon, aluminum, steel, and water soluble salts, (c) depositing an inorganic compound on the release layer by a reduced pressure environment technique to form a thin inorganic film, (d) laminating the side of the thin inorganic film on the side opposite the release layer to the layer of surface covering, and (e) removing the release layer to expose the thin inorganic film which functions as a wear layer.

9. The method of claim 8 wherein the surface covering comprises a material selected from the group consisting of hexanediol diacrylate, tripropylene glycol diacrylate, lauryl acrylate, β-carboxyethylacrylate, polyethylene, polypropylene, polyethyleneterephthalate, urea formaldehyde, and melamine formaldehyde.

10. The method of claim 8 wherein the release layer comprises a material selected from the group consisting of sodium chloride, potassium chloride, calcium chloride, strontium oxide, and calcium oxide.

11. The method of claim 8 wherein the inorganic compound is selected from the group consisting of aluminum oxide, silicon oxide, tin oxide, indium oxide, titanium dioxide, zirconium dioxide, tantalum oxide, chromium oxide, tungsten oxide, molybdenum oxide, aluminum nitride, boron nitride, silicon nitride, titanium nitride, zirconium nitride, carbon nitride, metals, metal pnictides, chalogenides, amorphous carbon, diamond like carbon, diamond, silicon oxynitride, aluminum oxynitride and combinations thereof.

12. The method of claim 8 further comprising applying a bonding material to the thin inorganic film on the side opposite the release layer to form a composite and wherein step (d) comprises laminating the bonding material side of the composite to the layer of surface covering.

13. A method of producing a wear layer on a surface covering comprising:

(a) forming a self-supporting release layer, the release layer being water soluble, (b) depositing a metal and/or metal compound on one surface of the release layer to form a thin metallic film having an exposed surface, (c) applying an organic composition to the exposed surface of the thin metallic film, and (d) washing the release layer with water to remove the release layer.

14. The method of claim 13 wherein the organic composition which is applied to the thin metallic film is a curable organic composition and the organic composition is cured to bond the thin metallic film to the organic composition.

15. A method of producing a continuous wear layer on a surface covering comprising:

(a) depositing a water soluble alkali or alkaline earth halide or oxide on a substrate to form a continuous release layer, b) depositing an inorganic material on the release layer to form a continuous thin inorganic film having an exposed surface opposite the release layer, (c) applying a curable organic composition to the exposed surface of the thin inorganic film, (d) curing the organic composition to bond the thin inorganic film to the organic composition, and (e) washing the release layer with water to remove the release layer.

16. The method of claim 15 wherein the release layer is NaCl.

17. The method of claim 15 wherein the curable composition is a urethane-acrylate.

18. The method of claim 15 wherein the thin inorganic film is aluminum oxide.

19. The method of claim 15 wherein steps (a) and (b) use electron beam deposition with a pressure below $10^{-3}$ Torr.

20. The surface covering of claim 15 wherein the surface covering is a floor covering.

* * * * *